United States Patent
Yen et al.

(10) Patent No.: US 7,145,975 B2
(45) Date of Patent: Dec. 5, 2006

(54) DIGITAL PHASE-LOCKED LOOP COMPILER

(75) Inventors: Ming-Nan Yen, Taipei County (TW);
Sheng Duo, Hsinchu (TW);
Shou-Chang Tsai, Chiai County (TW);
Koug Mou Liou, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 656 days.

(21) Appl. No.: 10/058,681

(22) Filed: Jan. 28, 2002

(65) Prior Publication Data

US 2003/0076913 A1 Apr. 24, 2003

(30) Foreign Application Priority Data

Oct. 24, 2001 (TW) ............................... 90126238 A

(51) Int. Cl.
*H03D 3/24* (2006.01)
(52) U.S. Cl. ...................... 375/376; 375/375; 327/147; 327/156
(58) Field of Classification Search ................ 375/376, 375/374, 375; 327/147–150, 156–159, 160, 327/155, 146; 331/17, DIG. 2
See application file for complete search history.

(56) References Cited

U.S. PATENT DOCUMENTS 4,151,485 A * 4/1979 LaFratta ..................... 331/1 A
5,373,255 A * 12/1994 Bray et al. .................. 331/1 A
5,815,042 A * 9/1998 Chow et al. .................. 331/57
5,856,762 A * 1/1999 Werker et al. ................ 331/11
5,977,836 A * 11/1999 Swan et al. .................. 331/1 A
6,366,174 B1 * 4/2002 Berry et al. .................. 331/78
6,392,496 B1 * 5/2002 Lee et al. ..................... 331/17
6,404,247 B1 * 6/2002 Wang .......................... 327/158

FOREIGN PATENT DOCUMENTS

JP 09-116426 5/1997
JP 11-112336 4/1999

OTHER PUBLICATIONS

A GMSK Modulation using a Delta-Segma Frequency Discriminator-based Synthesizer Wlater t. Bax et al IEEE vol. 36, No. 8 Aug. 2001.*

* cited by examiner

*Primary Examiner*—Temesghen Ghebretinsae
(74) *Attorney, Agent, or Firm*—J.C. Patents

(57) ABSTRACT

A digital phase-locked loop compiler includes a pre-divider, a phase digital converter, a digital-to-analog voltage converter, a voltage-control oscillator, a high-frequency oscillator, a post-divider, an out-divider, and a built-in self-tester. The digital phase-locked loop compiler operates in a digital mode and utilizes a preset phase adjusting value to reduce phase-locking time. Moreover, the absence of a low-pass filter in the digital phase-locked loop compiler and the small size of the built-in self-tester greatly reduce the overall area of the digital phase-locked loop compiler.

26 Claims, 6 Drawing Sheets

DIGITAL PHASE-LOCKED LOOP COMPILER

CROSS-REFERENCE TO RELATED APPLICATION

This application claims the priority benefit of Taiwan application serial no. 90126238, filed Oct. 24, 2001.

BACKGROUND OF THE INVENTION

1. Field of Invention

The present invention relates to a phase-locked loop compiler. More particularly, the present invention relates to a digital phase-locked loop compiler.

2. Description of Related Art

FIG. 1 is a block diagram showing a conventional analog phase-locked loop device. A conventional analog phase-locked loop device, comprises: a divider 102, 112, and 114, a phase-frequency detector 104, a comparator 106, a low pass filter 108, and a voltage control oscillator 110. The signal of a conventional analog phase-locked loop is analog and therefore phase-locking must be achieved through continuous adjustment of the analog signal. Hence, the phase-locking time is longer. Furthermore, the low-pass filter in a conventional analog phase-locked device often occupies as much as 80% of the area. With the filter occupying such a large area, it is inconvenient to add other circuits such as a built-in self-tester (BIST) around the phase-lock loop. In brief, a conventional analog phase-locked loop has the following disadvantages:
1. Latch-up time of the analog phase-locked loop is too long.
2. A low-pass filter that occupies too much of the available surface area is required.
3. The incorporation of a BIST and other circuits on the phase-locked loop device is difficult.

SUMMARY OF THE INVENTION

Accordingly, one object of the invention is to provide a digital phase-locked loop compiler capable of improving the latch-up time and the problem of a low-pass filter occupying too much area in the circuit so that the incorporation of BIST or other circuits are facilitated.

To achieve these and other advantages and in accordance with the purpose of the invention, as embodied and broadly described herein, the invention provides a digital phase-locked loop compiler. The digital phase-locked loop compiler comprises: a pre-divider, a phase digital converter, a digital-to-analog voltage converter, a voltage-control oscillator, a high frequency oscillator, a post-divider, an out-divider, and a built-in self-tester. The pre-divider divides down an input frequency into a comparable input frequency according to a pre adjusting value. The phase digital converter couples with the output of the pre-divider to output a phase adjusting value according to the comparable input frequency, the feedback frequency, and a sampling frequency. The digital-to-analog voltage converter couples with the output of the phase digital converter to output an adjusting voltage according to the phase adjusting value. The voltage-control oscillator couples with the output of the digital-to-analog voltage converter to output an output frequency according to the adjusting voltage. The high frequency oscillator couples with the input of the phase digital converter to issue a sampling frequency to sample the comparable input frequency and the feedback frequency. The post-divider couples with both the input of the phase digital converter and the output of the voltage-control oscillator for dividing down the output frequency into the feedback frequency according to a post adjusting value. The out-divider couples with the output of the voltage-control oscillator for dividing down the output frequency into a desired output frequency according to an output adjusting value. The built-in self-tester couples with the output of the phase digital converter to test the phase digital-locked loop according to the phase adjusting value.

In the first embodiment according to the present invention, the phase digital converter mentioned above comprises a phase-frequency detector, an up-down converter, and an arithmetic logic unit. Wherein, the phase-frequency detector couples with the output of both the pre-divider and post-divider to output a value-modifying signal according to the comparable input frequency and the feedback frequency. The up-down converter couples with the output of both the phase-frequency detector and the high frequency oscillator to output an adjusting signal according to the value-modifying signal. The arithmetic logic unit couples with both the up-down converter and the high frequency oscillator to output a phase adjusting value according to the adjusting signal.

Furthermore, the above sampling frequency can be 360 times the input frequency. The post-divider can adjust the necessary responsible cycle of the desired output frequency. The feedback frequency has a preset value. The phase adjusting value is a 9-bit digital signal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
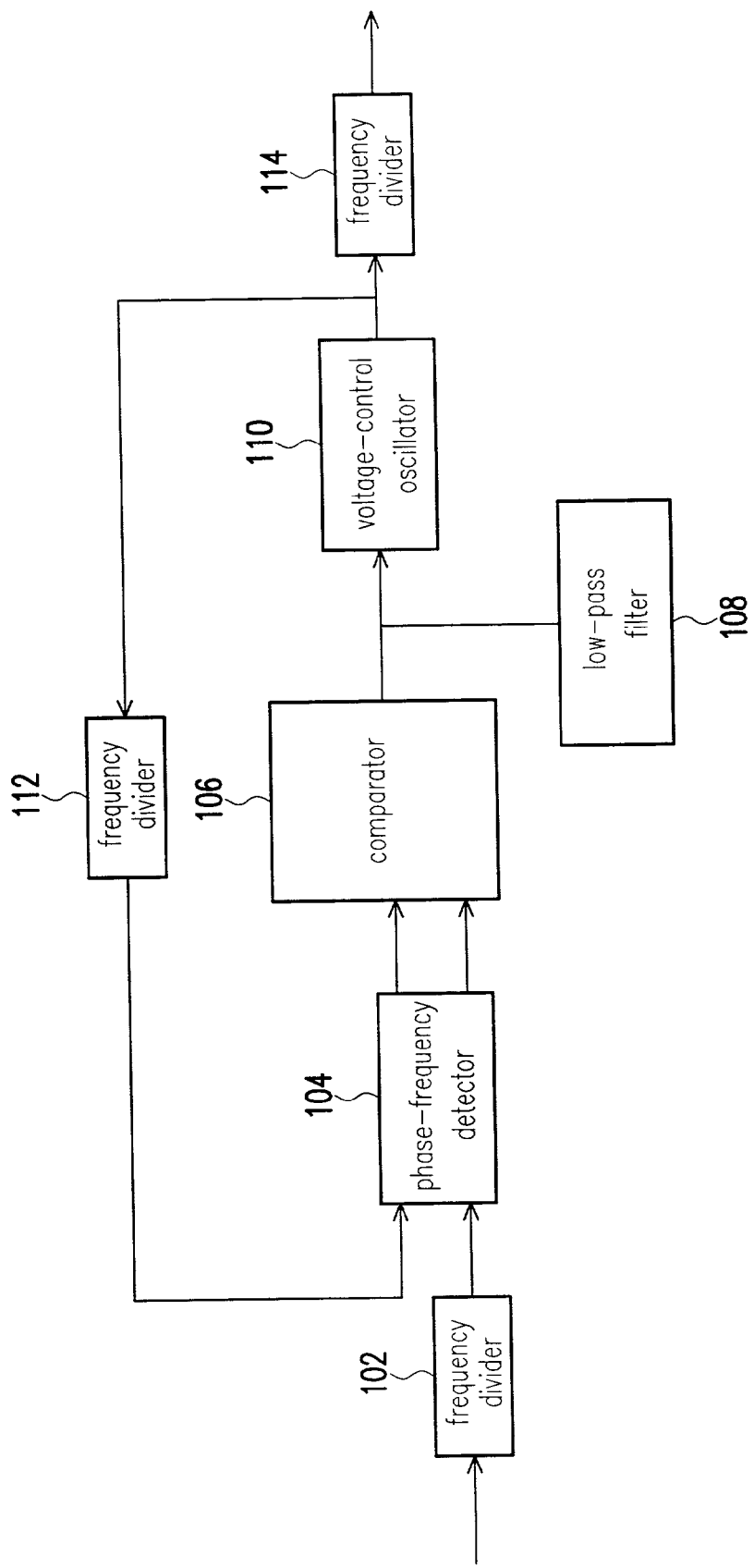
FIG. 1 is a block diagram showing a conventional analog phase-locked loop device.

Reference will now be made in detail to the present preferred embodiments of the invention, examples of which are illustrated in the accompanying drawings. Wherever possible, the same reference numbers are used in the drawings and the description to refer to the same or like parts.

Figure 2:
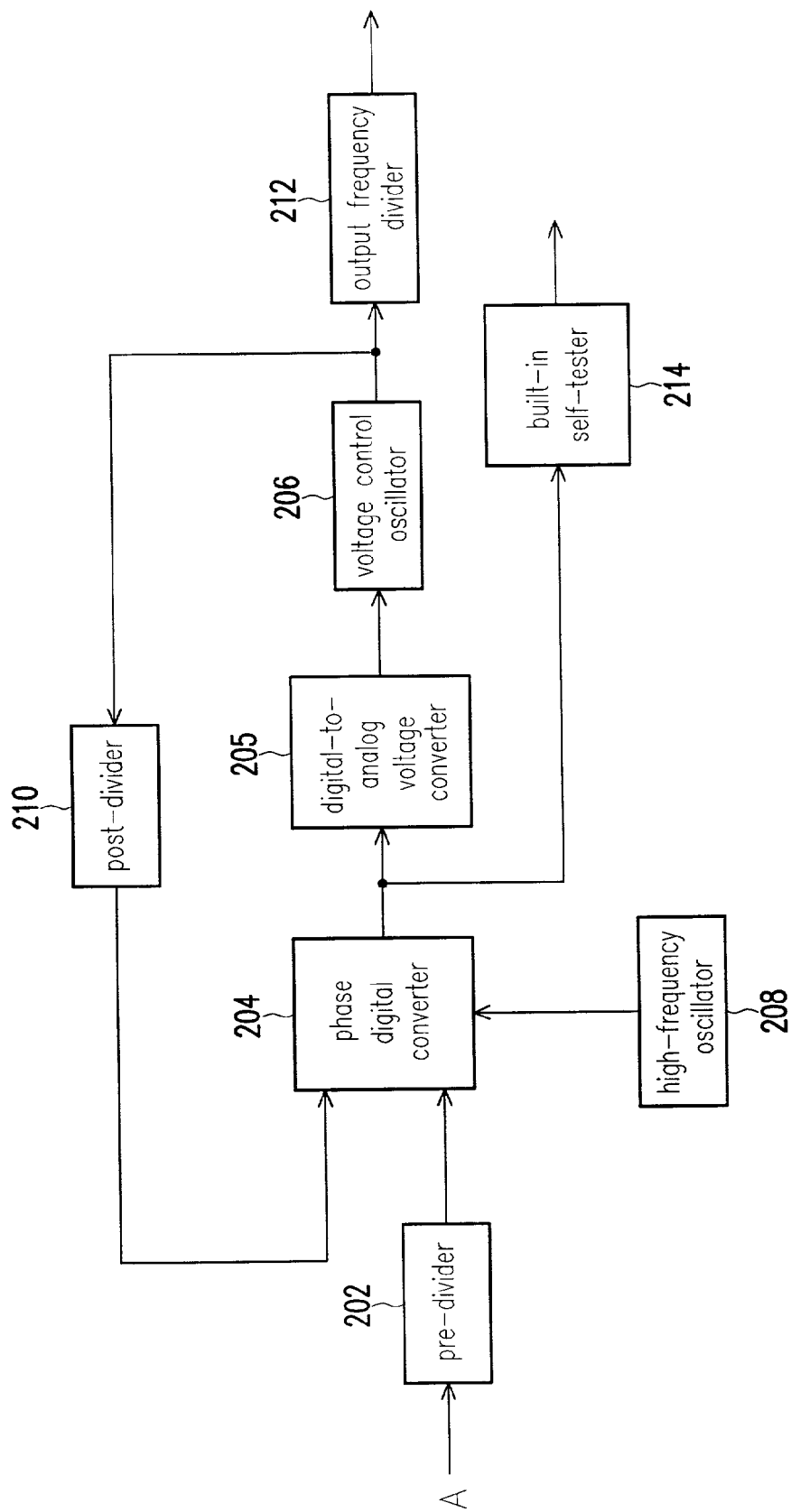
FIG. 2 is a block diagram showing a digital phase-locked loop compiler according to one preferred embodiment of this invention.

FIG. 2 is a block diagram showing a digital phase-locked loop compiler according to one preferred embodiment of this invention. As shown in FIG. 2, the digital phase-locked loop compiler includes a pre-divider 202, a phase digital converter 204, a digital-to-analog converter 205, a voltage-control oscillator 206, a high-frequency oscillator 208, a post-divider 210, an out-divider 212, and a built-in self-tester 214. Wherein, the pre-divider 202 divides down an input frequency into a comparable input frequency according to a pre adjusting value. The phase digital converter 204 couples with the output of the pre-divider 202 to output a phase-adjusting value according to the comparable input frequency, a feedback frequency, and a sampling frequency. The digital-to-analog voltage converter 205 couples with the output of the phase digital converter 204 to output an adjusting voltage according to the phase adjusting value. The voltage-control oscillator 206 couples with the output of the digital-to-analog voltage converter 205 to output an output frequency according to the adjusting voltage. The high frequency oscillator 208 couples with the input of the phase digital converter 204 to issue a sampling frequency according to the input frequency, the feedback frequency, and the sampling frequency. The post-divider 210 couples with both the input of the phase digital converter 204 and the output of the voltage-control oscillator 206 for dividing down the output frequency into feedback frequency according to a post adjusting value. The out-divider 212, which is optional, couples with the output of the voltage-control oscillator 206 for dividing down the output frequency into a desired output frequency according to the output adjusting value. The built-in self-tester 214 couples with the output of the phase digital converter 204 to test the phase digital-locked loop according to the phase adjusting value.

Assume most modules of the voltage-control oscillator 206 operate in frequency ranges from 1 MHz~10 MHz, 10 MHz~100 MHz, 100 MHz~200 MHz, and 200 MHz~300 MHz etc. . . . However, due to the final output module works in the frequency range 100 MHz~200 MHz, the frequency range 100 MHz~200 MHz is selected. In this embodiment, the digital-to-analog voltage converter 205 processes a preset phase adjusting value and outputs the value to the voltage-control oscillator 206. The voltage-control oscillator 206 then outputs an output frequency to the post-divider 210. Upon receiving the frequency, the post-divider 210 automatically divides down the output frequency to a feedback frequency according to the post adjusting value, and further outputs this feedback frequency to the phase digital converter 204. Therefore, if the signal A entering the pre-divider 202 is 30 MHz, the pre-divider 202 automatically divides down into a comparable frequency of 1 MHz according to the pre adjusting value, and further outputs the comparable frequency to the phase digital converter 204. The sampling frequency from the high frequency oscillator 208 serves to sample the comparable frequency and the feedback frequency, obtained from the above-mentioned phase adjusting value, in the phase digital converter 204. The phase digital converter 204 processes the two sample results to obtain a phase difference, and then converts it to a phase adjusting value. Afterwards, the voltage-control oscillator 206 outputs an output frequency according to the phase adjusting value. These procedures are repeated until the phase of the feedback frequency matches the phase of the previous comparable frequency. When the phase of the feedback frequency matches the phase of the previous comparable frequency, the built-in self-tester can compare the final phase adjusting value to the preset phase value to judge if the phase-locked loop compiler is working properly.

According to the first embodiment of the present invention, the phase adjusting value is a 9-bit digital signal and the frequency of the sampling frequency is 360 times of the comparable frequency. Moreover, the pre adjusting value mentioned above can be automatically set by the phase-locked loop compiler according to input frequency and the post adjusting value, and the output adjusting value is set according to the output frequency.

Figure 3:
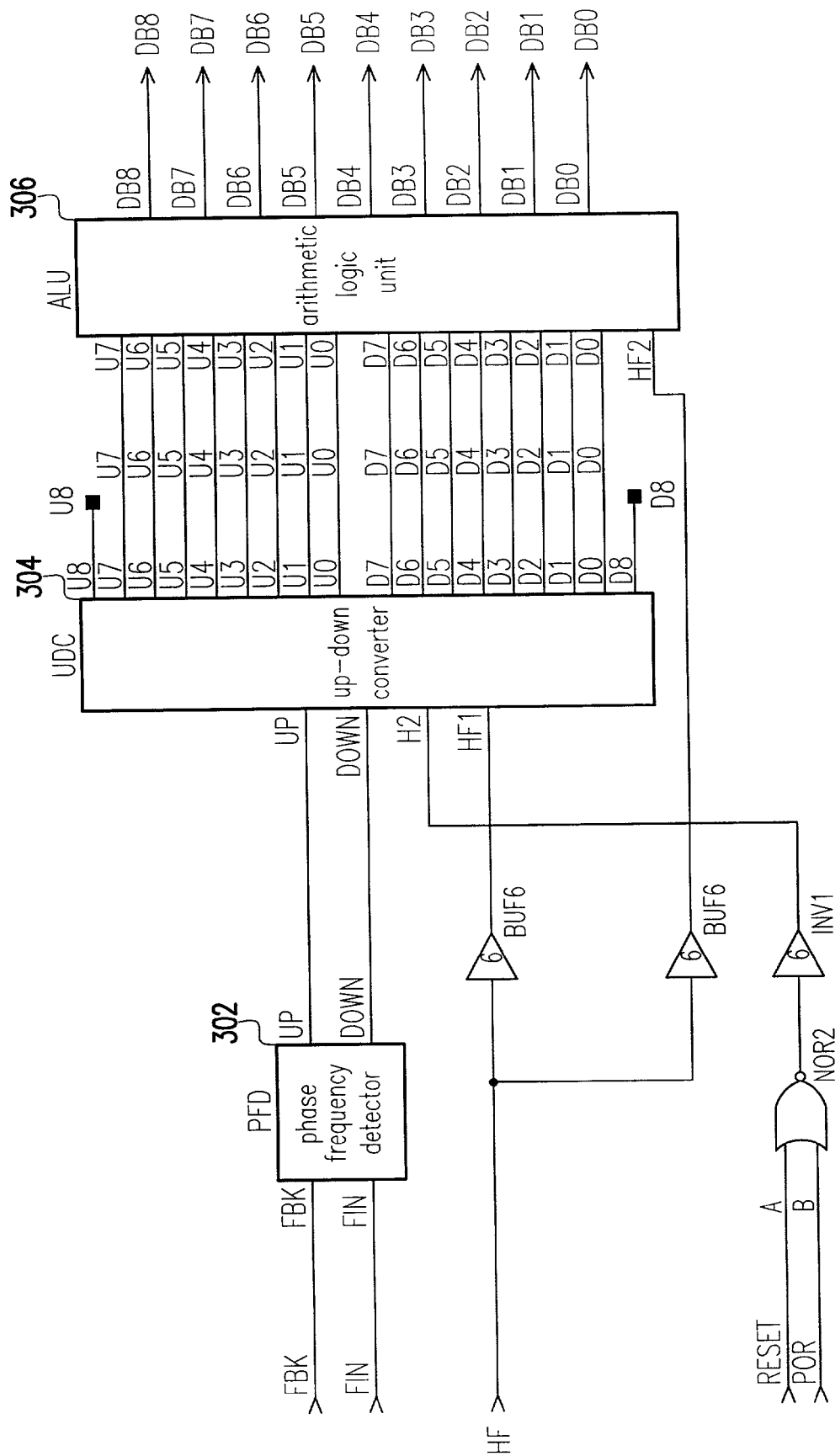
FIG. 3 is a block diagram showing the circuit of a phase digital converter according to the digital phase-locked loop compiler in FIG. 2.
Figure 4A:
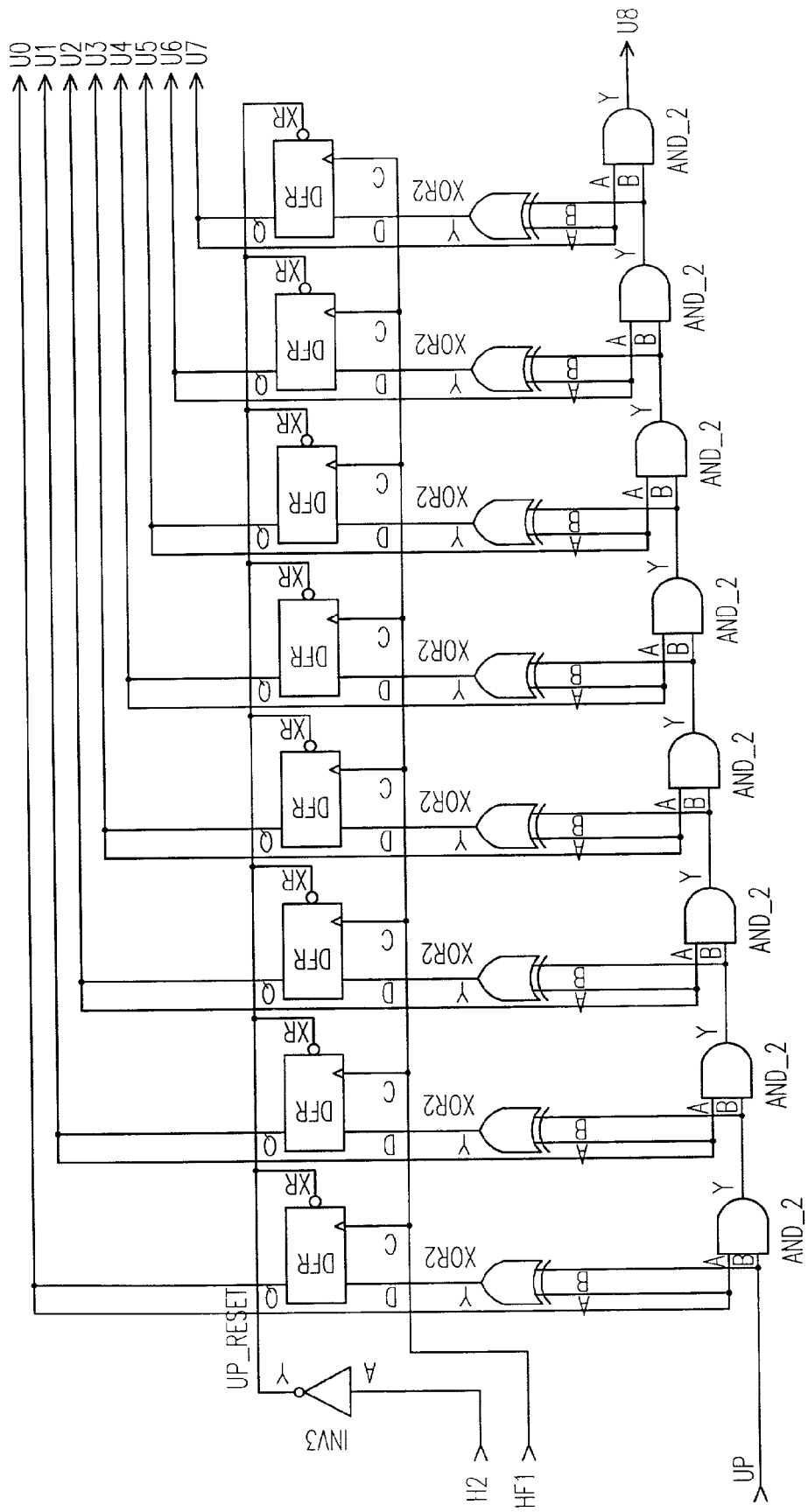
FIG. 4A–4B is a circuit diagram of an up-down converter according to the phase digital converter in FIG. 3 according to one preferred embodiment of this invention.
Figure 4B:
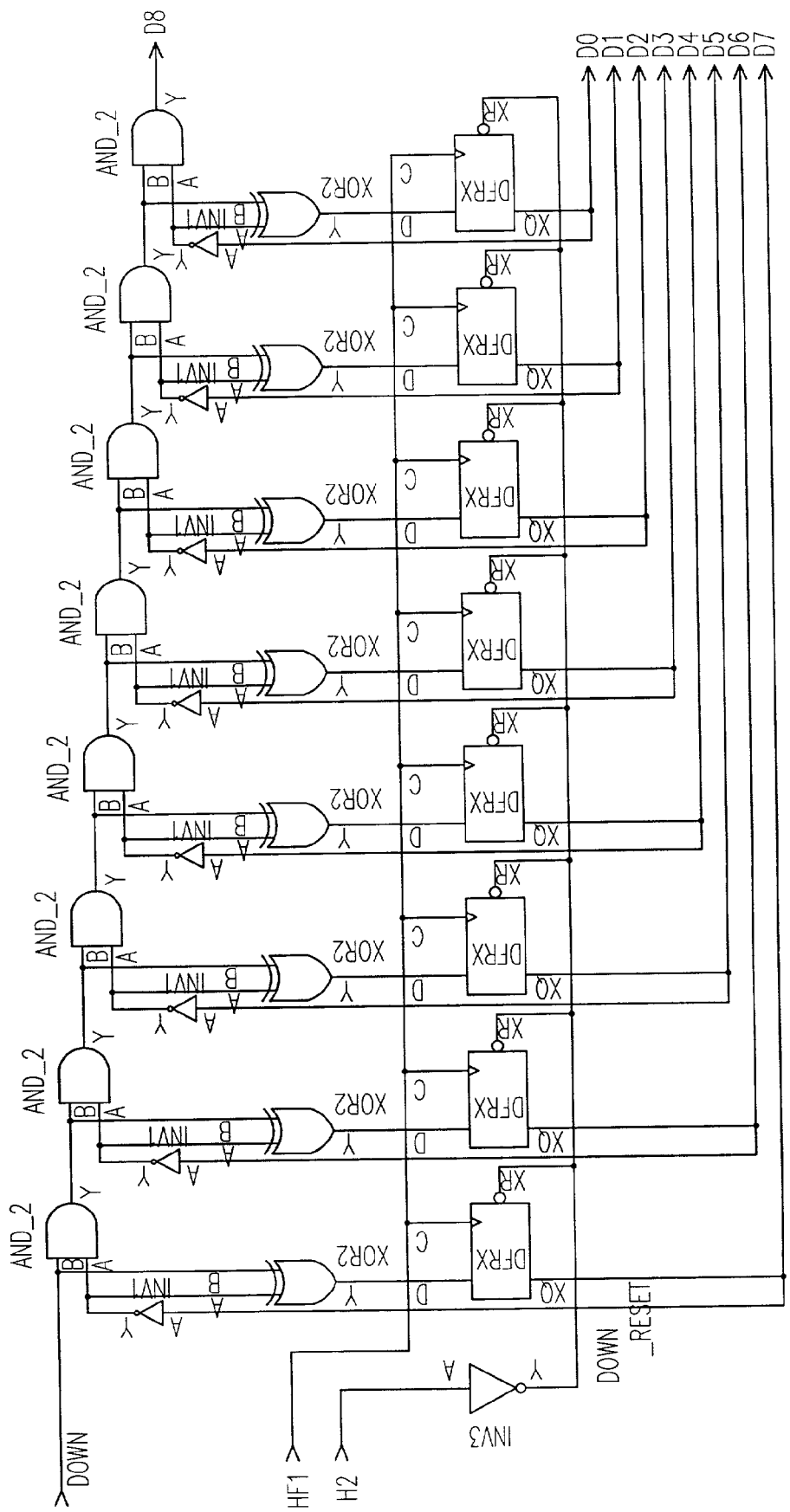

FIG. 3 is a block diagram showing the phase digital converter according to the digital phase-locked loop compiler in FIG. 2. As shown in FIG. 3, the phase digital converter includes a phase-frequency detector 302, an up-down converter 304, and an arithmetic logic unit 306. Wherein, the phase-frequency detector 302 couples with the output of both the pre-divider 202 and post-divider 210 to detect the frequency and phase of the comparable input signal and the feedback signal. The up-down converter 304 couples with the output of both the phase-frequency detector 302 and the high frequency oscillator 208 to output an adjusting signal according to the comparable input frequency, the feedback frequency, and the sampling frequency. The arithmetic logic unit 306 couples with both the up-down converter 304 and the high frequency oscillator 208 to output a phase adjusting value according to the adjusting signal. Whereby, the first embodiment of the up-down converter 304 is shown in FIG. 4A–4B.

Figure 5:
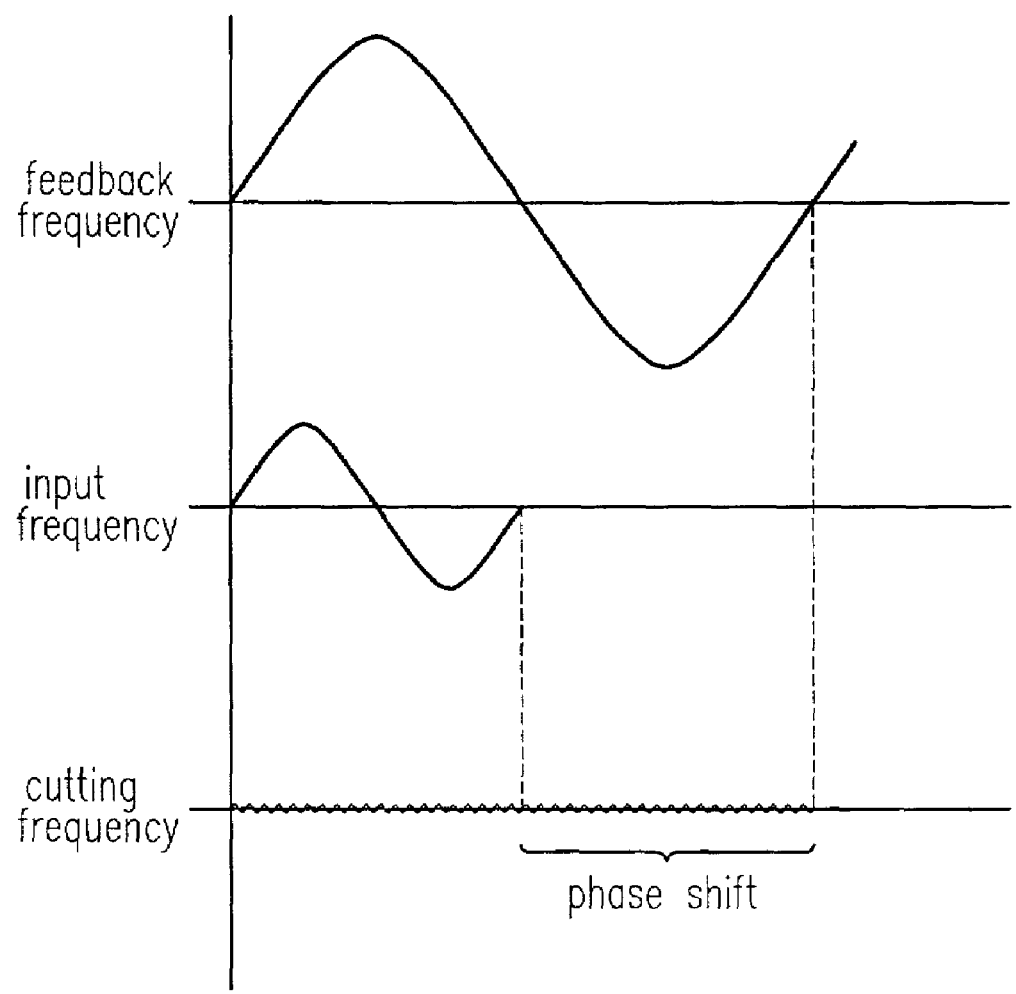
FIG. 5 is a graph showing the phase adjusting values according to the phase digital converter in FIG. 3.

After the phase-frequency detector 302 has detected both the comparable input frequency from the pre-divider 202 and the feedback frequency from the post-divider 210, the high frequency oscillator 208 outputs a sampling frequency to sample the phase of the input frequency and the phase of the feedback frequency. Thereafter, the up-down converter 304 will send out an adjusting signal, and following, the arithmetic logic unit 306 will output a phase adjusting value according to the adjusting signal. FIG. 5 shows a graph of the phase adjusting values according to the circuit in FIG. 3. The arithmetic logic unit 306 generates an input frequency after processing and that is the adjusting value.

In the digital phase-locked loop compiler of this invention, a high-frequency oscillator 208 is used to provide a sampling frequency to sample of the comparable input frequency and feedback frequency. However the high-frequency oscillator 208 can be external to be shared by other components. Whereby, the frequency of the sampling frequency is 360 times the comparable input frequency because the pre-divider can divide the comparable input frequency as low as 1 MHz for higher sampling frequency from the high-frequency oscillator 208. Thereafter, the phases of the input frequency and the feedback frequency are compared to obtain a phase adjusting value. The phase adjusting value indicates any phase shift between the input frequency and the feedback frequency. Hence, the phase-lock conditions can be obtained quickly. Furthermore, this invention also provides a preset phase adjusting value to obtain phase-lock condition in a short period.

Furthermore, a conventional phase-locked device requires the addition of a analog built-in testing device to perform a self-test. Such an analog built-in testing device is larger in size compared to the digital phase-locked testing device of the present invention because the analog built-in testing device requires a low-pass filter. As a result, the overall size of the digital phase-locked loop compiler is much smaller.

In conclusion, the major advantages of this invention includes the following:

1. Feedback phase-locking time is effectively reduced.

2. Without the need to incorporate a large low-pass filter as in an analog phase-locked device, the area is greatly reduced 3. The built-in self-tester is only used for comparing digital signal, therefore, the circuit is relatively simple and requires a small area.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital phase-locked loop compiler, comprising:
   a phase digital converter for comparing a feedback signal with a feedback frequency and a reference signal at a reference frequency, sampling the compared result at a predetermined frequency, and outputting a digital phase adjusting signal;
   a digital-to-analog voltage converter for converting the digital phase adjusting signal into an analog phase adjusting signal;
   a voltage-control oscillator for outputting an output signal at the output frequency under the adjustment of the analog phase adjusting signal;
   a post-divider for feeding back and dividing down the output signal to the phase digital converter based upon a predetermined post adjusting value; and
   a high-frequency oscillator for issuing a sampling signal at the predetermined frequency to sample the feedback signal with the feedback frequency and the reference signal at the reference frequency.

2. The compiler in claim 1, further comprising a pre-divider for dividing down an input signal into the reference signal at the reference frequency based upon a pre-adjusting value.

3. The compiler in claim 1, further comprising an out-divider for dividing down the output signal at the output frequency to produce a desired output signal at a desired output frequency according to an output adjusting value.

4. The compiler in claim 1, wherein the phase digital converter further comprises a phase-frequency detector for outputting a value-modifying signal according to the feedback signal with the feedback frequency and the reference signal at the reference frequency.

5. The compiler in claim 4, wherein the phase digital converter further comprises an up-down converter for outputting an adjusting signal according to the value-modifying signal.

6. The compiler in claim 5, wherein the phase digital converter further comprises an arithmetic logic unit for outputting a phase adjusting value according to the adjusting signal.

7. The compiler of claim 1, further comprising a built-in self-tester.

8. The compiler in claim 1, wherein the predetermined post adjusting value for the post divider is adjustable.

9. The compiler of claim 1, wherein the sampling frequency is 360 times the comparable input frequency.

10. The compiler of claim 1, wherein the feedback frequency has a preset value.

11. The compiler of claim 2, wherein the pre adjusting value is automatically set by the digital phase-locked loop compiler according to the input frequency.

12. The compiler of claim 1, wherein the post adjusting value is set according to the required output frequency.

13. The compiler of claim 3, wherein the output adjusting value is set according to the required output frequency.

14. The compiler of claim 6, wherein the phase adjusting value is a 9-bit digital signal.

15. A digital phase-locked loop compiler, comprising:
   a phase digital converter for comparing a feedback signal with a feedback frequency and a reference signal at a reference frequency, sampling the compared result at a predetermined frequency, and outputting a digital phase adjusting signal;
   a digital-to-analog voltage converter for converting the digital phase adjusting signal into an analog phase adjusting signal;
   a voltage-control oscillator for outputting an output signal at the output frequency under the adjustment of the analog phase adjusting signal; and
   a post-divider for feeding back and dividing down the output signal to the phase digital converter based upon a predetermined post adjusting value;
   wherein the phase digital converter further comprises:
      a phase-frequency detector for outputting a value-modifying signal according to the feedback signal with the feedback frequency and the reference signal at the reference frequency;
      an up-down converter for outputting an adjusting signal according to the value-modifying signal; and
      an arithmetic logic unit for outputting a phase adjusting value according to the adjusting signal.

16. The compiler in claim 15, further comprising a pre-divider for dividing down an input signal into the reference signal at the reference frequency based upon a pre-adjusting value.

17. The compiler in claim 15, further comprising a high-frequency oscillator for issuing a sampling signal at the predetermined frequency to sample the feedback signal with the feedback frequency and the reference signal at the reference frequency.

18. The compiler in claim 15, further comprising an out-divider for dividing down the output signal at the output frequency to produce a desired output signal at a desired output frequency according to an output adjusting value.

19. The compiler of claim 15, further comprising a built-in self-tester.

20. The compiler in claim 15, wherein the predetermined post adjusting value for the post divider is adjustable.

21. The compiler of claim 15, wherein the sampling frequency is 360 times the comparable input frequency.

22. The compiler of claim 15, wherein the feedback frequency has a preset value.

23. The compiler of claim 16, wherein the pre-adjusting value is automatically set by digital phase-locked loop compiler according to the input frequency.

24. The compiler of claim 15, wherein the post adjusting value is set according to the required output frequency.

25. The compiler of claim 18, wherein the output adjusting value is set according to the required output frequency.

26. The compiler of claim 15, wherein the phase adjusting value is a 9-bit digital signal.

* * * * *